(12) United States Patent
Magnee et al.

(10) Patent No.: US 10,784,257 B2
(45) Date of Patent: Sep. 22, 2020

(54) INTEGRATING SILICON-BJT TO A SILICON-GERMANIUM-HBT MANUFACTURING PROCESS

(71) Applicant: NXP B.V., Eindhoven (NL)

(72) Inventors: Petrus Hubertus Cornelis Magnee, Malden (NL); Pieter Simon van Dijk, Renkum (NL); Johannes Josephus Theodorus Marinus Donkers, Valkenswaard (NL); Dolphin Abessolo Bidzo, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/120,098

(22) Filed: Aug. 31, 2018

(65) Prior Publication Data
US 2020/0075585 A1   Mar. 5, 2020

(51) Int. Cl.
*H01L 27/082*   (2006.01)
*H01L 21/02*   (2006.01)
(Continued)

(52) U.S. Cl.
CPC ...... *H01L 27/0825* (2013.01); *H01L 21/0217* (2013.01); *H01L 21/02164* (2013.01); *H01L 21/02271* (2013.01); *H01L 21/02532* (2013.01); *H01L 21/02595* (2013.01); *H01L 21/02598* (2013.01); *H01L 21/02645* (2013.01); *H01L 21/2253* (2013.01); *H01L 21/266* (2013.01);
(Continued)

(58) Field of Classification Search
CPC ............ H01L 27/0825; H01L 29/7325; H01L 21/8222; H01L 21/8249; H01L 29/66242; H01L 27/0623; H01L 29/66295
See application file for complete search history.

(56) References Cited

U.S. PATENT DOCUMENTS

| 5,079,447 A | 1/1992 | Lien et al. |
| 5,101,123 A | 3/1992 | Ten Eyck |

(Continued)

FOREIGN PATENT DOCUMENTS

GB   2419230 A   4/2006

OTHER PUBLICATIONS

Abessolo Bidzo, D. et al. "ESD Protection Circuit for a Sub-1dB Noise Figure LNA in a SiGe:C BiCMOS Technology", IEEE 2013 35th Electrical Overstress/Electrostatic Discharge Symposium, 9 pgs. (Oct. 2013).

(Continued)

*Primary Examiner* — Julia Slutsker

(57) ABSTRACT

This specification discloses methods for integrating a SiGe-based HBT (heterojunction bipolar transistor) and a Si-based BJT (bipolar junction transistor) together in a single manufacturing process that does not add a lot of process complexity, and an integrated circuit that can be fabricated utilizing such a streamlined manufacturing process. In some embodiments, such an integrated circuit can enjoy both the benefits of a higher RF (radio frequency) performance for the SiGe HBT and a lower leakage current for the Si-based BJT. In some embodiments, such an integrated circuit can be applied to an ESD (electrostatic discharge) clamp circuit, in order to achieve a lower, or no, yield-loss.

13 Claims, 8 Drawing Sheets

(51) Int. Cl.
   *H01L 21/225* (2006.01)
   *H01L 21/266* (2006.01)
   *H01L 21/306* (2006.01)
   *H01L 21/324* (2006.01)
   *H01L 21/8222* (2006.01)
   *H01L 21/8249* (2006.01)
   *H01L 27/02* (2006.01)
   *H01L 27/06* (2006.01)
   *H01L 29/04* (2006.01)
   *H01L 29/165* (2006.01)
   *H01L 29/66* (2006.01)
   *H01L 29/732* (2006.01)
   *H01L 29/737* (2006.01)

(52) U.S. Cl.
   CPC ...... *H01L 21/30604* (2013.01); *H01L 21/324* (2013.01); *H01L 21/8222* (2013.01); *H01L 21/8249* (2013.01); *H01L 27/0248* (2013.01); *H01L 27/0623* (2013.01); *H01L 29/04* (2013.01); *H01L 29/165* (2013.01); *H01L 29/66242* (2013.01); *H01L 29/66295* (2013.01); *H01L 29/7325* (2013.01); *H01L 29/7375* (2013.01)

(56) References Cited

U.S. PATENT DOCUMENTS

| | | | |
|---|---|---|---|
| 6,396,107 B1 | 5/2002 | Brennan et al. | |
| 6,492,859 B2 | 12/2002 | Vashchenko et al. | |
| 6,667,867 B2 | 12/2003 | Vashchenko et al. | |
| 6,936,509 B2 | 8/2005 | Coolbaugh et al. | |
| 6,977,398 B2 | 12/2005 | Coolbaugh et al. | |
| 9,847,408 B1* | 12/2017 | Jain | H01L 21/8222 |
| 2005/0156193 A1 | 7/2005 | Dahl et al. | |
| 2016/0086934 A1* | 3/2016 | Huitsing | H01L 27/0248 257/526 |
| 2016/0172350 A1* | 6/2016 | Dey | H01L 29/78 361/56 |
| 2018/0040611 A1* | 2/2018 | Jain | H01L 27/0825 |
| 2018/0240897 A1* | 8/2018 | Liu | H01L 29/66242 |

OTHER PUBLICATIONS

Deixler, P. et al. "QUBiC4X: an $f_T/f_{max}$=130/140GHz SiGe:C-BiCMOS Manufacturing Technology with Elite Passives for Emerging Microwave Applications", IEEE Proceedings of the 2004 Meeting Bipolar/BiCMOS Circuits and Technology, 4 pgs. (Sep. 2004).

Van Noort. W. D. et al. "BiCMOS Technology Improvements for Microwave Application", IEEE Bipolar/BiCMOS Circuits and Technology Meeting, 4 pgs. (Oct. 2008).

Baudry, et al., "High performance 0.25 μm SiGe and SiGe:C HBTs using non selective epitaxy," Proceedings of the 2001 Bipolar/BICMOS Circuits and Technology Meeting, Sep. 30, 2001, pp. 52-55.

Behammer, et al., "Si/SiGe HBTs for Application in Low Power ICs", Solid-State Electronics, Apr. 1, 1996, vol. 39, No. 4, pp. 471-480.

* cited by examiner

700

```
Begin
  │
  ▼
```

Forming a patterned seed layer over all regions of a silicon substrate except for regions associated with the SiGe-based HBT
705

Depositing a SiGe base layer over all regions of the silicon substrate, wherein the SiGe base layer is poly-crystalline over all regions of the silicon substrate except the SiGe base layer is mono-crystalline over the regions associated with the SiGe-based HBT
710

Removing the SiGe base layer over regions of the silicon substrate associated with the Si-based BJT
715

Depositing a poly Si layer over all regions of the silicon substrate, wherein the poly Si layer is either in-situ p+ doped or doped p+ by means of implantation
720

Depositing an isolated dielectric layer over all regions of the silicon substrate
725

Etching emitter window(s)
730

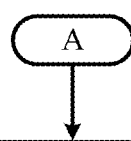

Implanting base doping and optionally local collector doping in emitter window(s) over regions of the silicon substrate associated with the Si-based BJT, wherein a mask protects emitter window(s) over regions of the silicon substrate associated with the SiGe-based HBT
735

Annealing the silicon substrate to diffuse p-doping from the p+ poly Si layer to layers below the p+ poly Si layer, wherein the p-doping from the p+ poly Si layer is diffused to the SiGe base layer for the regions associated with the SiGe-based HBT, wherein the p-doping from the p+ poly Si layer is diffused to the silicon substrate for the regions associated with the Si-based BJT
740

Forming inside spacer to isolate between an emitter n+ poly Si layer and the p+ poly Si layer
745

Depositing and etching the emitter n+ poly Si layer
750

Annealing the silicon substrate to diffuse n-doping from the emitter n+ poly Si layer into the base form an emitter-base junction for both the SiGe-based HBT and the Si-based BJT.
755

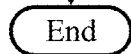

FIG. 7B

INTEGRATING SILICON-BJT TO A SILICON-GERMANIUM-HBT MANUFACTURING PROCESS

FIELD

The described embodiments relate generally to methods and devices related to the manufacturing and use of a SiGe HBT (silicon-germanium heterojunction bipolar transistor), and more particularly to methods and devices related to the manufacturing and use of a Si BJT (silicon bipolar junction transistor) integrated together with a SiGe HBT.

BACKGROUND

Both the SiGe HBT (heterojunction bipolar transistor) and the Si BJT (bipolar junction transistor) have their individual strengths, so it can be advantageous to integrate both types of transistors in a single integrated circuit in order to fully utilize their individual strengths. However, in general, it is not straightforward to integrate both a SiGe-based HBT and a Si-based BJT in the same technology, without adding a lot of process complexity.

Therefore, there are strong motivations to develop a single manufacturing process that can integrate both a SiGe-based HBT and a Si-based BJT, without adding a lot of process complexity.

SUMMARY

This specification discloses methods for integrating a SiGe-based HBT (heterojunction bipolar transistor) and a Si-based BJT (bipolar junction transistor) together in a single manufacturing process that does not add a lot of process complexity, and an integrated circuit that can be fabricated utilizing such a streamlined manufacturing process. In some embodiments, such an integrated circuit can enjoy both the benefits of a higher RF (radio frequency) performance for the SiGe HBT and a lower leakage current for the Si-based BJT. In some embodiments, such an integrated circuit can be applied to an ESD (electrostatic discharge) clamp circuit, in order to achieve a lower, or no, yield-loss.

In summary, for some embodiments of such a streamlined manufacturing process, with the addition of one extra [non-critical] implant mask, and re-using the base-polysilicon and emitter-polysilicon layers from the SiGe HBT, an implanted-base Si-BJT can be created. Since the SiGe layer, with potentially a high density of crystal-defects, is removed from the Si-BJT, unwanted [emitter-to-collector] leakage in this device due to crystal defects is thereby eliminated. As an example, the power-stage in an ESD clamp (e.g., crowbar circuit) is usually large, resulting in high yield-loss when applying a SiGe HBT. The Si-BJT (replacing the SiGe HBT) will have a [much] lower RF-performance, e.g. lower fT, but for the intended use-case in the power-stage in an ESD Clamp, this is not relevant.

In some embodiments such a streamlined manufacturing process can be created by combining an implanted-base NPN Si-BJT with a epitaxially grown SiGe-base HBT in the same technology, re-using the extrinsic base connection and poly-emitter for both, without adding complexity.

The present invention provides for a method for integrating a SiGe-based HBT (heterojunction bipolar transistor) and a Si-based BJT (bipolar junction transistor) in a single manufacturing process, the method comprising: (a) forming a patterned seed layer over all regions of a silicon substrate except for regions associated with the SiGe-based HBT; (b) depositing a SiGe base layer over all regions of the silicon substrate, wherein the SiGe base layer is poly-crystalline over all regions of the silicon substrate except the SiGe base layer is mono-crystalline over the regions associated with the SiGe-based HBT; (c) removing the SiGe base layer over regions of the silicon substrate associated with the Si-based BJT; (d) depositing a poly Si layer over all regions of the silicon substrate, wherein the poly Si layer is either in-situ p+ doped or doped p+ by means of implantation; (e) depositing an isolated dielectric layer over all regions of the silicon substrate; (f) etching emitter window(s); (g) implanting base doping and optionally local collector doping in emitter window(s) over regions of the silicon substrate associated with the Si-based BJT, wherein a mask protects emitter window(s) over regions of the silicon substrate associated with the SiGe-based HBT; (h) annealing the silicon substrate to diffuse p-doping from the p+ poly Si layer to layers below the p+ poly Si layer, wherein the p-doping from the p+ poly Si layer is diffused to the SiGe base layer for the regions associated with the SiGe-based HBT, wherein the p-doping from the p+ poly Si layer is diffused to the silicon substrate for the regions associated with the Si-based BJT; (i) forming inside spacer to isolate between an emitter n+ poly Si layer and the p+ poly Si layer; (j) depositing and etching the emitter n+ poly Si layer; (k) annealing the silicon substrate to diffuse n-doping from the emitter n+ poly Si layer into the base to form an emitter-base junction for both the SiGe-based HBT and the Si-based BJT.

In some embodiments, a device manufactured using the method has a lower emitter-to-collector leakage due to replacement of SiGe-based HBT with Si-based BJT, wherein the Si-based BJT has a lower emitter-to-collector leakage in the device due to elimination of the SiGe base layer which has a high density of crystal defects that cause emitter-to-collector leakage.

In some embodiments, the device manufactured using the method has a lower RF (radio frequency) performance due to the replacement of SiGe-based HBT with Si-based BJT, wherein the lower RF performance is not relevant for an intended use of the device.

In some embodiments, the single manufacturing process is a BiCMOS process.

In some embodiments, the device is an ESD (electrostatic discharge) clamp circuit.

In some embodiments, the device is a power stage in an ESD (electrostatic discharge) crowbar circuit.

In some embodiments, the step of removing the SiGe base layer over regions of the silicon substrate associated with the Si-based BJT comprises use of a mask already present in the single manufacturing process for any device that requires a direct connection between the p+ base poly Si layer and the silicon substrate.

In some embodiments, polarity of the SiGe-based HBT and the Si-based BJT devices is reversed from NPN to PNP, wherein the n-doping is replaced by p-doping and the p-doping is replaced by n-doping, wherein the n+ poly Si is replaced by p+ poly Si and the p+ poly Si is replaced by n+ poly Si.

In some embodiments, the patterned seed layer is comprising of one or more of the following: (i) silicon dioxide, (ii) silicon nitride, (iii) undoped poly Si.

In some embodiments, the SiGe base layer is comprising of one or more of the following: (i) SiGe alloy of the form $Si(1-X)Ge(X)$, (ii) Si together with SiGe alloy of the form Si(1–X)Ge(X), (iii) a 3-layer structure of Si/Si(1–X)Ge(X)/Si, (iv) a 3-layer structure of undoped Si/Si(1–X)Ge(X)/p-Si.

In some embodiments, the isolated dielectric layer is comprising of one or more of the following: (i) LPCVD (low pressure chemical vapor deposition) silicon dioxide, (ii) silicon dioxide, (iii) silicon nitride.

In some embodiments, the method further comprising: (1) forming an etch-protect layer between the SiGe base layer and the p+ poly Si layer over the regions associated with the SiGe-based HBT.

In some embodiments, the etch-protect layer is LPCVD (low pressure chemical vapor deposition) silicon dioxide.

The present invention also provides for an integrated circuit having a substrate comprising a plurality of bipolar transistors including a SiGe-based HBT (heterojunction bipolar transistor) and a Si-based BJT (bipolar junction transistor); (a) the SiGe-based HBT comprising a HBT collector region formed in a HBT active region in between adjacent insulation regions in the substrate, a SiGe base layer stacked over the HBT active region, and a HBT emitter stacked over the SiGe base layer, and (b) the Si-based BJT comprising a BJT collector region formed in a BJT active region in between adjacent insulation regions in the substrate, a Si base layer formed in the BJT active region over the collector region, and a BJT emitter stacked over the Si base layer, (c) wherein the HBT collector region and the BJT collector region are formed in the same Si substrate, (d) wherein the SiGe base layer and the Si base layer are connected to a common p+ poly Si layer, wherein the common p+ poly Si layer is patterned and etched to form electrical connections of a circuit, (e) wherein the HBT emitter and the BJT emitter are formed from a common n+ poly Si layer, wherein the common n+ poly Si layer is patterned and etched to form further electrical connections of the circuit.

In some embodiments, the integrated circuit has a lower emitter-to-collector leakage due to replacement of SiGe-based HBT with Si-based BJT, wherein the Si-based BJT has a lower emitter-to-collector leakage in the integrated circuit due to elimination of the SiGe base layer which has a high density of crystal defects that cause emitter-to-collector leakage.

In some embodiments, the integrated circuit has a lower RF (radio frequency) performance due to the replacement of SiGe-based HBT with Si-based BJT, wherein the lower RF performance is not relevant for an intended use of the integrated circuit.

In some embodiments, the substrate further comprising CMOS (complementary metal-oxide-semiconductor) transistors.

In some embodiments, the integrated circuit comprises a Darlington NPN bipolar power stage in an ESD (electrostatic discharge) crowbar circuit.

The present invention further provides for a method comprising: (a) a npn SiGe-based HBT (heterojunction bipolar transistor) manufacturing process; (b) integrating a npn Si-based BJT (bipolar junction transistor) manufacturing process to the npn SiGe-based HBT manufacturing process.

In some embodiments, integrating the npn Si-based BJT (bipolar junction transistor) manufacturing process to the npn SiGe-based HBT manufacturing process comprises: (i) re-using a base poly Si layer and an emitter poly Si layer from the npn SiGe-based HBT manufacturing process, (ii) adding one extra implant mask.

The above summary is not intended to represent every example embodiment within the scope of the current or future Claim sets. Additional example embodiments are discussed within the Figures and Detailed Description below. Other aspects and advantages of embodiments of the present invention will become apparent from the following detailed description taken in conjunction with the accompanying drawings.

BRIEF DESCRIPTION OF THE DRAWINGS

In general.

In detail, FIG. 1 shows formation of a patterned seed layer and deposition of a SiGe base layer, in accordance with some embodiments of the invention.

FIG. 2 shows removal of the SiGe base layer over Si-based BJT regions, in accordance with some embodiments of the invention.

FIG. 3 shows deposition of a poly Si layer and an isolated dielectric layer, in accordance with some embodiments of the invention.

FIG. 4 shows etch of emitter window(s) and implant of base doping, in accordance with some embodiments of the invention.

FIG. 5 shows anneal of the silicon substrate to diffuse p-doping from the p+ poly Si layer and formation of inside spacer, in accordance with some embodiments of the invention.

FIG. 6 shows deposition and etch of the emitter n+ poly Si layer, together with anneal of the silicon substrate to form an emitter-base junction, in accordance with some embodiments of the invention.

FIGS. 7A and 7B together show a process flow diagram of a method for integrating a SiGe-based HBT (heterojunction bipolar transistor) and a Si-based BJT (bipolar junction transistor) together in a single manufacturing process, in accordance with some embodiments of the invention.

DETAILED DESCRIPTION

Figure 1:
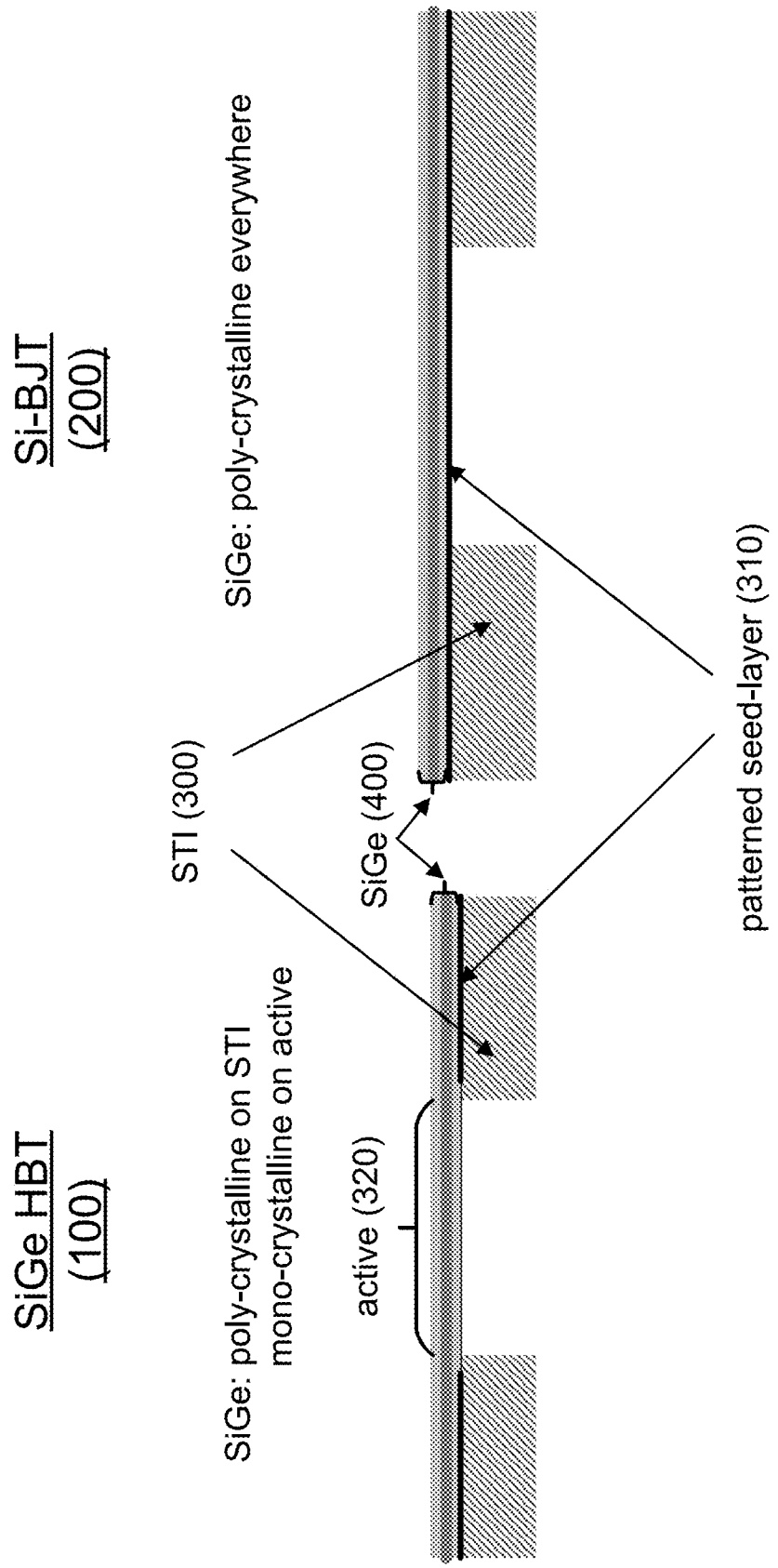
FIGS. 1-6 show various stages in a single streamlined manufacturing process that can fabricate both a SiGe-based HBT (heterojunction bipolar transistor) and a Si-based BJT (bipolar junction transistor), in accordance with some embodiments of the invention.

It will be readily understood that the steps and components of the embodiments as generally described herein and illustrated in the appended figures could be arranged and designed in a wide variety of different order and configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Both the SiGe HBT (heterojunction bipolar transistor) and the Si BJT (bipolar junction transistor) have their individual strengths, so integrating both types of transistors in a single integrated circuit can be advantageous to fully utilizing their individual strengths. However, integrating both a SiGe-based HBT and a Si-based BJT in the same technology can be complicated, so there is a need to develop such a single manufacturing process (which integrates both a SiGe-based HBT and a Si-based BJT) without adding a lot of process complexity.

This specification discloses methods for implementing such a single streamlined manufacturing process, and an integrated circuit that can be fabricated by such a streamlined manufacturing process. In some embodiments, such an integrated circuit can include a SiGe HBT architecture consisting of a non-selectively grown SiGe base-stack, with a double-poly architecture, which deploys an implanted base Si-BJT, on top.

In some embodiments, for such an integrated circuit, the base-polysilicon layer is used to connect the SiGe intrinsic base.

In some embodiments, for such an integrated circuit, an emitter-polysilicon layer, deposited in an etched emitter-window in the base-poly, forms the emitter connection.

In some embodiments, for such an integrated circuit, by removing the SiGe layer [locally] prior to deposition of the base-poly, an implanted-base Si-BJT can be added by using a mask already present in the single manufacturing process for any device that requires a direct connection between the p+ base poly Si layer and the silicon substrate. As an example, in some embodiments, the mask can be for a variable capacitor diode. As a further example, in some embodiments, the mask can be for a variable capacitor diode for an ESD (electrostatic discharge) clamp circuit.

In some embodiments, for such an integrated circuit, the emitter-window etch through the base-poly is shared, stopping on the SiGe base in the HBT and on the collector epi in the BJT.

In some embodiments, for such an integrated circuit, one [non-critical] implantation mask needs to be added, to implant the base of the Si-BJT through the emitter-window, while protecting the emitter-window of the SiGe-HBT.

In some embodiments, for such an integrated circuit, the emitter-poly is again shared between BJT and HBT.

In some embodiments, for such an integrated circuit, some of the transistors can be designed to use BJT, instead of HBT. Such an integrated circuit will have less ICEO-leakage (i.e., collector-to-emitter leakage), because the BJT does not suffer from (epitaxial) crystal defects due to a strained SiGe base present in the HBT. This in turn can result in lower, or no, yield-loss.

As an example, in some embodiments, such a single streamlined manufacturing process can be used to manufacture an integrated circuit device for an ESD (electrostatic discharge) clamp circuit. In some embodiments, the ESD (electrostatic discharge) clamp circuit can be an ESD (electrostatic discharge) crowbar circuit. In some embodiments, the integrated circuit device can be a power stage in an ESD (electrostatic discharge) crowbar circuit. In some embodiments, the integrated circuit device can be a Darlington NPN bipolar power stage in an ESD (electrostatic discharge) crowbar circuit.

In some embodiments, such an ESD clamp circuit with a [NPN] bipolar output-stage can handle high voltages and drain high current-levels. However, when implementing in an advanced SiGe-HBT BiCMOS process, the circuit can also potentially suffer from enhanced collector-to-emitter leakage (ICEO-leakage) due to crystal defects in the strained SiGe layer. In active circuitry, this ICEO-leakage does not need to result in yield-loss, because transistors can be switched off actively with the correct biasing.

In an ESD-clamp, the transistor needs to be biased close to on-stage, to respond quickly in case of an ESD event. Hence, ICEO-leakage in the ESD-clamp may result in yield-loss due to unacceptably high off-state leakage current.

The SiGe HBT is introduced for its superior RF (radio frequency) performance, but the higher frequency performance does not have any benefits for the ESD protection, and is therefore not needed. Hence, there are clear advantages to implementing a single streamlined manufacturing process that can produce both a SiGe-based HBT and a Si-based BJT, after adding minimal additional complexity to the manufacturing process. It is also clear that such a process can be effectively applied to devices or parts of devices that do not require the higher RF (radio frequency) performance of the HBT, so that the HBT components can be replaced by the lower leakage BJT components. An ESD clamp is provided as an example of such a device, but it should be obvious that many other devices can also benefit from the lower leakage advantage, when the higher RF performance is not required. In other words, such a single streamlined manufacturing process (that can be used for fabrication of both a SiGe-based HBT and a Si-based BJT) can be effectively applied to any devices or parts of devices that can benefit from both the higher RF performance of a SiGe-based HBT and the lower leakage current of a Si-based BJT.

FIGS. 1-6 shows the implementation of such a single streamlined manufacturing process that can fabricate both a SiGe-based HBT (100) and a Si-based BJT (200), in accordance with some embodiments of the invention. In FIGS. 1-6, the formation of both transistors are shown in a side-to-side cross-section view (i.e., a SiGe-based HBT (100) is shown on the left side and a Si-based BJT (200) is shown on the right side).

FIG. 1 shows that STI (shallow trench isolation) (300) can be applied as the isolation technology for a Si substrate. It is not shown in FIG. 1, but, in some embodiments, LOCOS (LOCal Oxidation of Silicon) can also be applied as the isolation technology for the Si substrate.

FIG. 1 also shows that a patterned seed-layer (310) can be deposited over all regions of a silicon substrate except for regions associated with the SiGe-based HBT. In some embodiments, the patterned seed-layer (310) can be used to define the active region (320) of the SiGe HBT (i.e., by not depositing the seed-layer in the active region (320) of the SiGe HBT, or by etching away the seed-layer from the active region (320) of the SiGe HBT). In some embodiments, the patterned seed-layer (310) can be comprising of one or more of the following: (a) silicon dioxide, (b) silicon nitride, and (c) undoped poly Si. In some embodiments, the silicon dioxide can be LPCVD (low pressure chemical vapor deposition) Si dioxide. In some embodiments, the patterned seed-layer (310) can be 50 nm thick.

FIG. 1 further shows that a SiGe base layer (400) is deposited over all regions of the Si substrate. The SiGe layer (400) is poly-crystalline over all regions associated with the Si-BJT. For the regions associated with the SiGe HBT, the SiGe layer (400) is poly-crystalline over regions on STI and mono-crystalline over active regions (320). Therefore, the SiGe base layer (400) is poly-crystalline over all regions of the silicon substrate except the SiGe base layer (400) is mono-crystalline over the regions associated with the SiGe-based HBT (i.e., the active region of the SiGe HBT). The patterned seed-layer (310) causes the SiGe layer (400) to become poly-crystalline. The absence of the seed-layer over the active region of the Si HBT can cause the SiGe layer to become mono-crystalline.

In some embodiments, the SiGe base layer (400) is comprising of one or more of the following: (a) SiGe alloy of the form $Si(1-X)Ge(X)$, (b) Si together with SiGe alloy of the form $Si(1-X)Ge(X)$, (c) a 3-layer structure of $Si/Si(1-X)Ge(X)/Si$, (d) a 3-layer structure of undoped $Si/Si(1-X)Ge(X)/p-Si$. In some embodiments, p-Si can represent p-doped Si. In FIG. 1 (and also FIGS. 2-6), the SiGe base layer (400) is shown as a 3-layer structure. In some embodiments, the 3-layer structure shown in FIG. 1-6 can be (a) a 3-layer structure of $Si/Si(1-X)Ge(X)/Si$, or (b) a 3-layer structure of undoped $Si/Si(1-X)Ge(X)/p-Si$.

Figure 2:
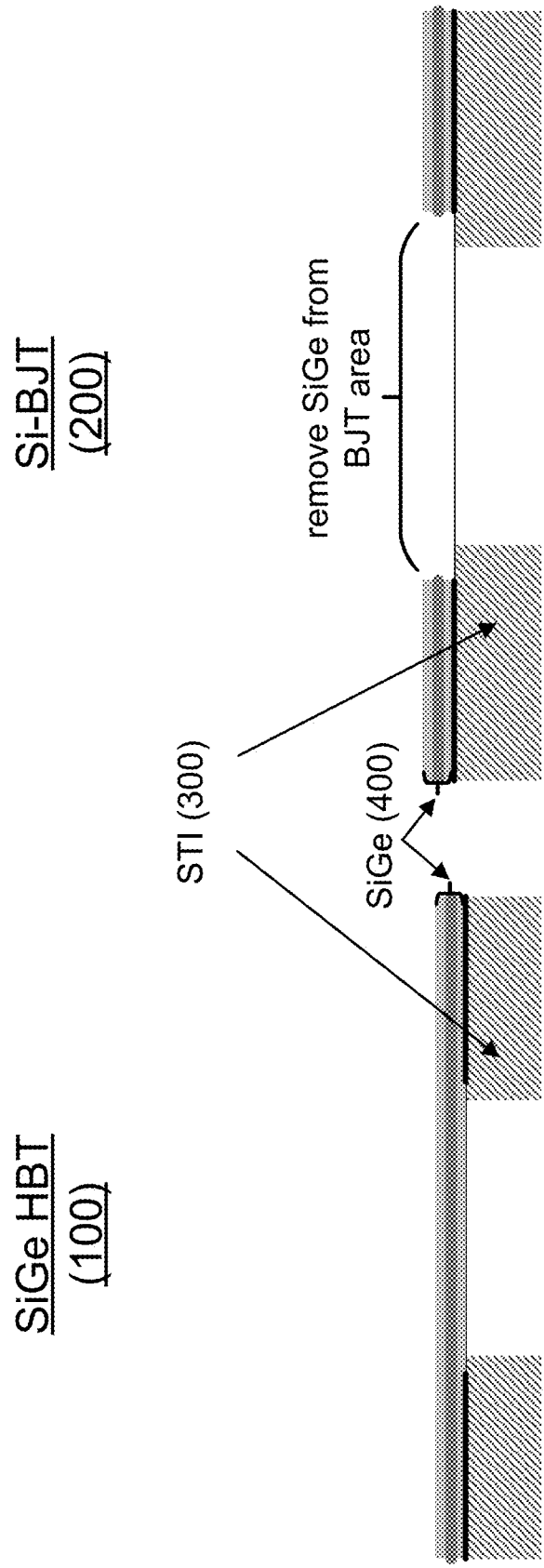

FIG. 2 shows that a single streamlined manufacturing process can remove the SiGe base layer (400) over regions of the silicon substrate associated with the Si-based BJT. In some embodiments, this step of removing the SiGe base layer [locally] prior to deposition of the base-poly enables for the addition of an implanted-base Si-BJT. In some embodiments, this step of removing the SiGe base layer (400) can include the use of a mask already present in the single manufacturing process for any device that requires a direct connection between the p+ base poly Si layer and the silicon substrate. In some embodiments, the mask can be for a variable capacitor diode. In some embodiments, the mask can be for a variable capacitor diode for an ESD (electrostatic discharge) clamp circuit.

Figure 3:
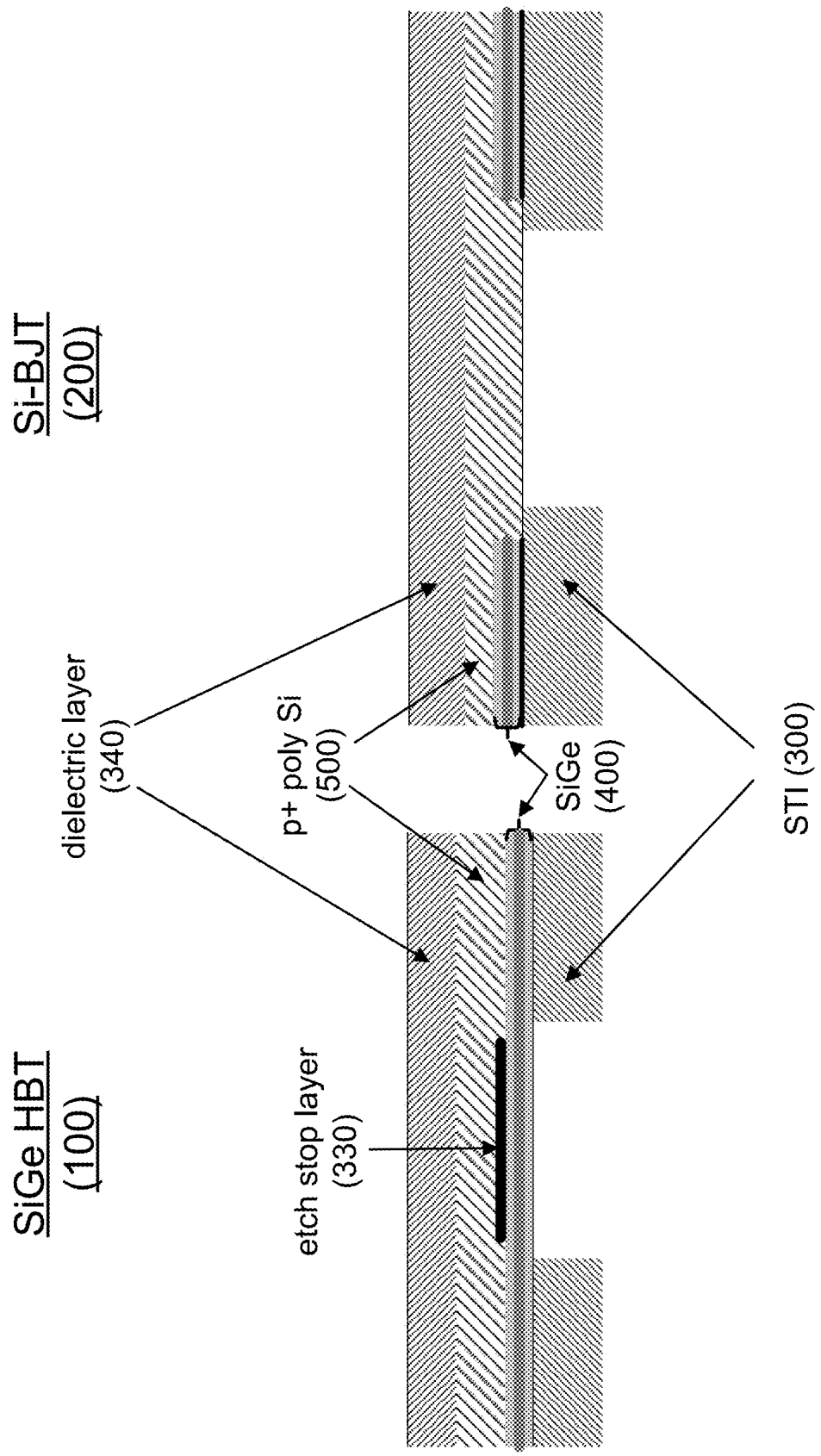

FIG. 3 shows that, subsequent to the SiGe removal step of FIG. 2, a poly Si layer (500) can be deposited over all regions of the silicon substrate. In some embodiment, this poly Si layer (500) can be either in-situ p+ doped or doped p+ by means of implantation. After the poly Si layer (500) has been deposited, an isolated dielectric layer (340) can be deposited over all regions of the silicon substrate. In some embodiment, the isolated dielectric layer (340) can be comprising of one or more of the following: (a) LPCVD (low pressure chemical vapor deposition) silicon dioxide, (b) silicon dioxide, (c) silicon nitride. This means that the isolated dielectric layer can be made up of LPCVD (low pressure chemical vapor deposition) silicon dioxide, or silicon dioxide deposited by other means, or silicon nitride, or any combination of these three materials, or any structural combination of these three materials (e.g., two layers of LPCVD dioxide plus one layer of silicon nitride sandwiched in between).

FIG. 3 also shows that, in some embodiments, an etch-protect (or etch-stop) layer (330) can be formed between the SiGe base layer (400) and the p+ poly Si layer (500) over the regions associated with the SiGe-based HBT. In some embodiments, the etch-protect layer (330) can be formed between the SiGe base layer (400) and the p+ poly Si layer (500) over the regions associated with the active regions of the SiGe-based HBT. The purpose of the etch-protect layer (330) is protect the SiGe layer (400) from being etched away by the p+ poly Si etch. In some embodiments, the etch-protect layer (330) can be LPCVD (low pressure chemical vapor deposition) silicon dioxide. It is not shown in FIG. 3, but, in some embodiments, it can be possible to not have the etch-protect layer (330) (i.e., skip the formation of the etch-protect layer (330)).

Figure 4:
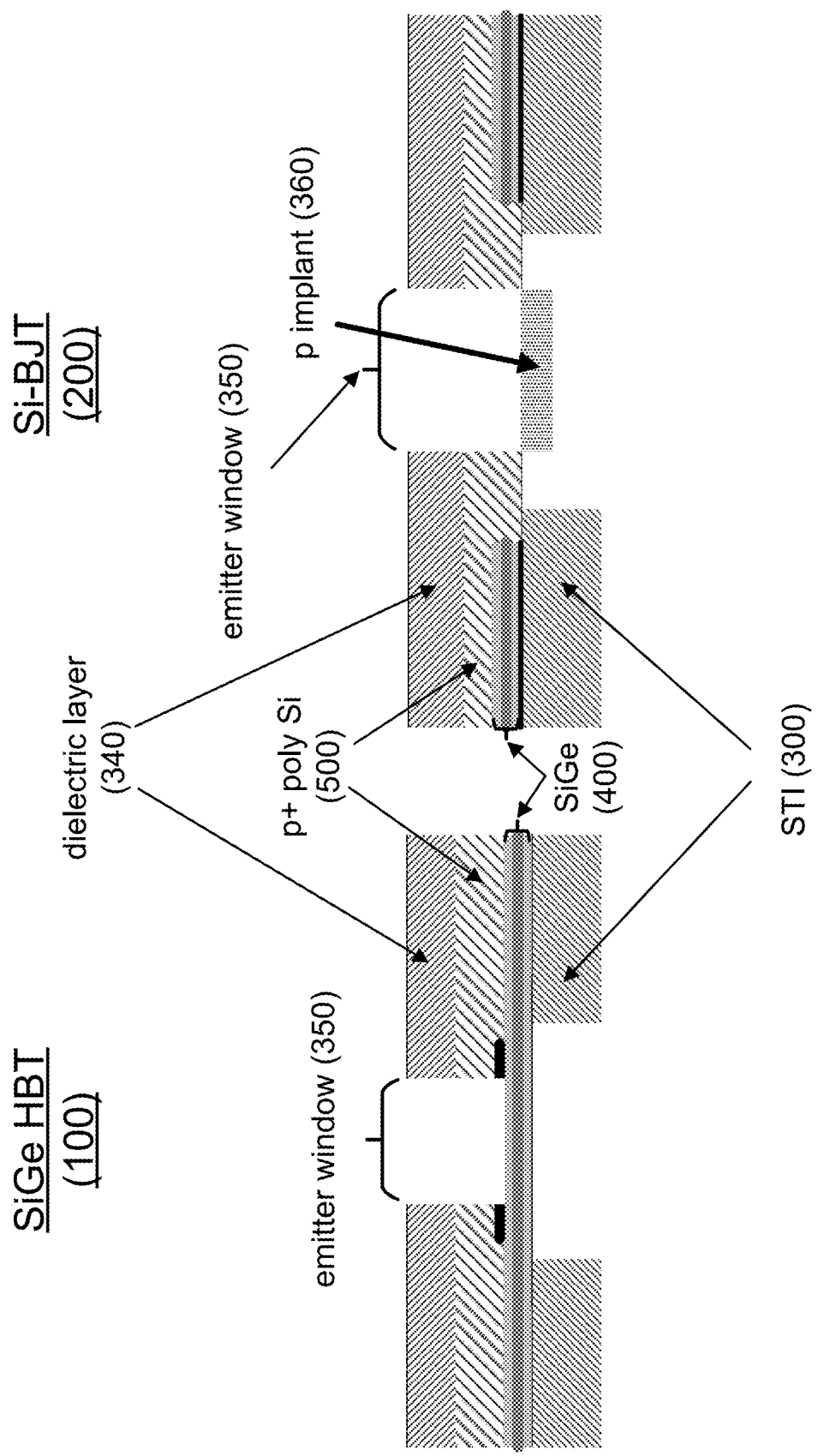

FIG. 4 shows that a single streamlined manufacturing process can include a step of etching emitter window(s) (350) (over both SiGe HBT (100) and Si-BJT (200)). Following the step of etching emitter window(s) (350), there can be a step of implanting base doping and optionally local collector doping in emitter window(s) over regions of the silicon substrate associated with the Si-based BJT, wherein a mask can protect emitter window(s) from implant over regions of the silicon substrate associated with the SiGe-based HBT. In other word, the Si-BJT will receive the implant, while the SiGe HBT will be protected from the implant by a mask. The step of implant is shown in FIG. 4 as a p-doped implant (360).

Figure 5:
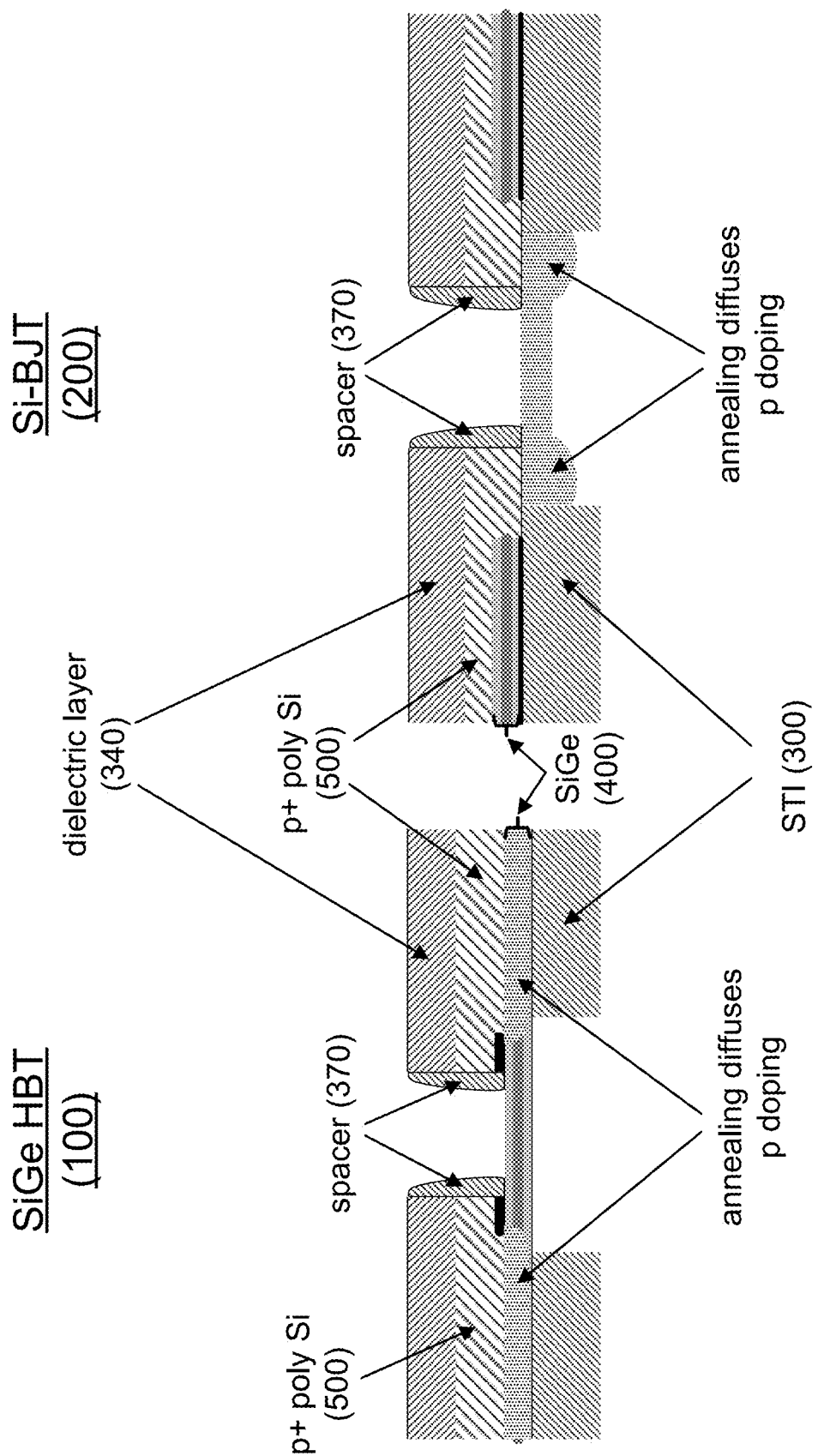

FIG. 5 shows that there is a step of annealing the silicon substrate to diffuse p-doping from the p+ poly Si layer to layers below the p+ poly Si layer, wherein the p-doping from the p+ poly Si layer is diffused to the SiGe base layer for the regions associated with the SiGe-based HBT, wherein the p-doping from the p+ poly Si layer is diffused to the silicon substrate for the regions associated with the Si-based BJT. In FIG. 5, it can be seen that for the SiGe-based HBT, the p-doping from the p+ poly Si layer is diffused to the SiGe base layer below the p+ poly layer. For the Si-based BJT, it can be seen that the p-doping from the p+ poly Si layer is diffused to the silicon substrate directly below the p+ poly Si layer. Of course, the anneal will also diffuse the p-doping from p-doped implant (360) of FIG. 4 (which was implanted to the Si substrate regions exposed from the emitter window(s) etch).

Additionally, FIG. 5 also shows a step of forming an inside spacer (370) to isolate between an emitter n+ poly Si layer (520) and the p+ poly Si layer (500). Note that the emitter n+ poly Si layer (520) is not shown in FIG. 5, because it has not yet been deposited. The emitter n+ poly Si layer (520) will be formed inside the emitter window(s) (350) for both the SiGe HBT and the Si-BJT. In some embodiments, the inside spacer (370) can be a LPCVD (low pressure chemical vapor deposition) dielectric.

Figure 6:
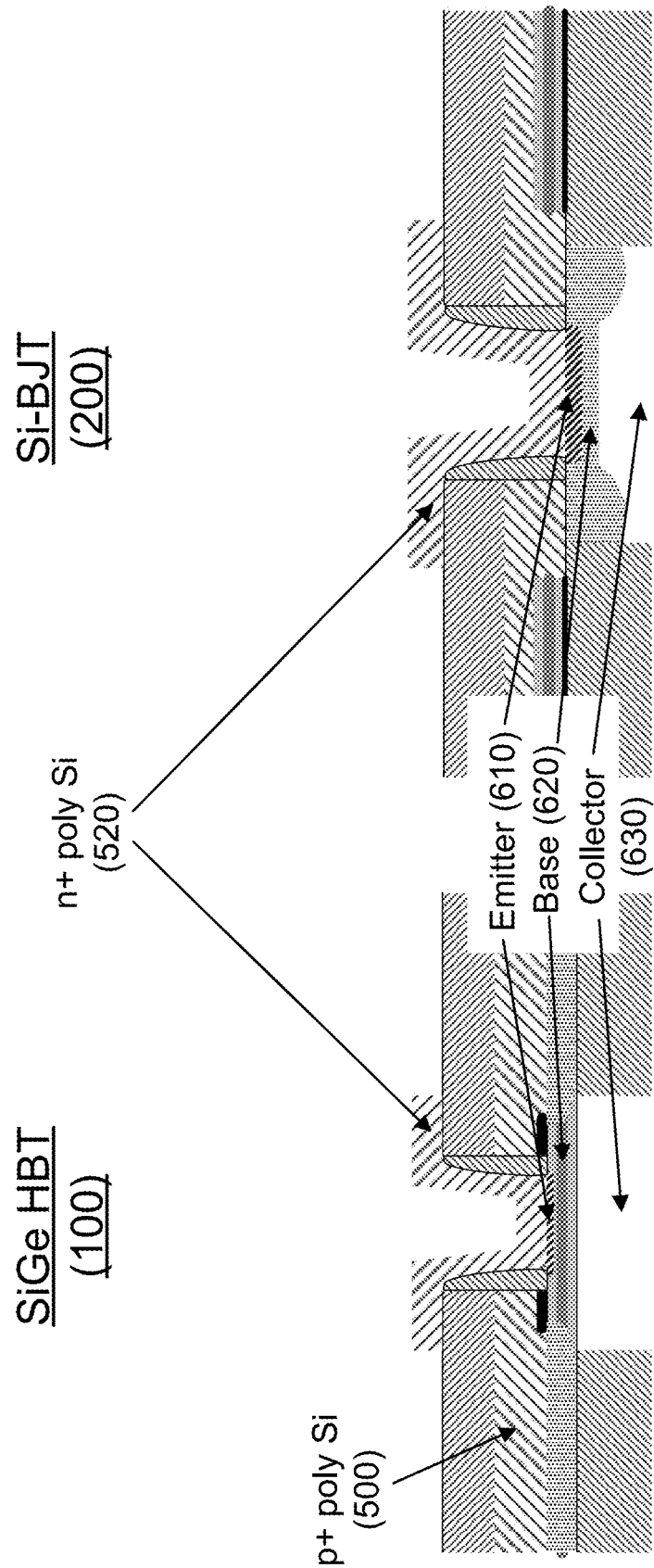

FIG. 6 shows that there is a step of depositing and etching the emitter n+ poly Si layer (520). In some embodiment, this poly Si layer (520) can be either in-situ n+ doped or doped n+ by means of implantation. In FIG. 6, it can be seen that the inside spacer (370) can isolate the emitter n+ poly Si layer (520) from the p+ poly Si layer (500).

FIG. 6 also shows that there is a step of annealing the silicon substrate to diffuse n-doping from the emitter n+ poly Si layer into the base to form an emitter-base junction for both the SiGe-based HBT and the Si-based BJT. In FIG. 6, it can be seen that for the SiGe-based HBT, the emitter-base junction is formed by diffusing n-doping from the emitter n+ poly Si layer (520) into the SiGe base layer that is below the emitter window(s) (350). Therefore, for the SiGe-based HBT, the emitter (610) is formed by the n-doping from the emitter n+ poly Si layer (520) diffusing into the SiGe base layer. The base (620) is formed by the p-doped SiGe base layer. The collector (630) is formed by the n-doped Si substrate below the emitter window(s) (350).

For the Si-based BJT, it can be seen that the emitter-base junction is formed by diffusing n-doping from the emitter n+ poly Si layer (520) into the Si substrate that is below the emitter window(s) (350). Therefore, for the Si-based BJT, the emitter (610) is formed by the n-doping from the emitter n+ poly Si layer (520) diffusing into the Si substrate base layer. The base (620) is formed by the Si substrate base layer. The collector (630) is formed by the n-doped Si substrate below the emitter window(s) (350).

In some embodiments, a buried layer n+ Si can also be formed.

In some embodiments, a device manufactured using a single streamlined manufacturing process (for example, as shown by FIGS. 1-6) can have a lower emitter-to-collector leakage due to replacement of SiGe-based HBT with Si-based BJT, wherein the Si-based BJT has a lower emitter-to-collector leakage in the device due to elimination of the SiGe base layer which has a high density of crystal defects that cause emitter-to-collector leakage.

In some embodiments, the device manufactured using a single streamlined manufacturing process (for example, as shown by FIGS. 1-6) can have a lower RF (radio frequency) performance due to the replacement of SiGe-based HBT with Si-based BJT. But the lower RF performance is not relevant for an intended use of the device, so replacement of SiGe-based HBT with Si-based BJT can be still done to enjoy the benefit of a lower emitter-to-collector leakage due to replacement of SiGe-based HBT with Si-based BJT. This in turn can result in lower, or no, yield-loss, due to the lower emitter-to-collector leakage.

In some embodiments, the single streamlined manufacturing process (for example, as shown by FIGS. 1-6) can be a BiCMOS process, so that CMOS transistors can also be included in the integrated circuit device produced using the single streamlined manufacturing process.

In some embodiments, the device produced using the single streamlined manufacturing process (for example, as shown by FIGS. 1-6) can be an ESD (electrostatic discharge) clamp circuit.

In some embodiments, the device produced using the single streamlined manufacturing process (for example, as shown by FIGS. 1-6) can be a power stage in an ESD (electrostatic discharge) crowbar circuit.

In some embodiments, the single streamlined manufacturing process (for example, as shown by FIGS. 1-6) can fabricate NPN SiGe-based HBT and NPN Si-based BJT. In some embodiments, the single streamlined manufacturing process (for example, as shown by FIGS. 1-6) can be modified to produce PNP SiGe-based HBT and PNP Si-based BJT. Therefore, polarity of the SiGe-based HBT and the Si-based BJT devices is reversed from NPN to PNP, wherein the n-doping is replaced by p-doping and the p-doping is replaced by n-doping, wherein the n+ poly Si is replaced by p+ poly Si and the p+ poly Si is replaced by n+ poly Si.

The present invention also provides for an integrated circuit having a substrate that includes SiGe-based HBTs (heterojunction bipolar transistors) and Si-based BJTs (bipolar junction transistors). The SiGe-based HBT includes: (a) a HBT collector region formed in a HBT active region in between adjacent insulation regions in the substrate, (b) a SiGe base layer stacked over the HBT active region, and (c) a HBT emitter stacked over the SiGe base layer. The Si-based BJT includes: (a) a BJT collector region formed in a BJT active region in between adjacent insulation regions in the substrate, (b) a Si base layer formed in the BJT active region over the collector region, and (c) a BJT emitter stacked over the Si base layer. For this integrated circuit, the HBT collector region and the BJT collector region are formed in the same Si substrate. For this integrated circuit, the SiGe base layer and the Si base layer are connected to a common p+ poly Si layer, wherein the common p+ poly Si layer is patterned and etched to form electrical connections of a circuit. For this integrated circuit, the HBT emitter and the BJT emitter are formed from a common n+ poly Si layer, wherein the common n+ poly Si layer is patterned and etched to form further electrical connections of the circuit.

In some embodiments, this integrated circuit can be manufactured using the single streamlined manufacturing process (as shown by FIGS. 1-6). In some embodiments, this integrated circuit can be manufactured using some other single streamlined manufacturing process.

In some embodiments, this integrated circuit can have a lower emitter-to-collector leakage due to replacement of SiGe-based HBT with Si-based BJT, wherein the Si-based BJT has a lower emitter-to-collector leakage in the integrated circuit due to elimination of the SiGe base layer which has a high density of crystal defects that cause emitter-to-collector leakage.

In some embodiments, this integrated circuit can have a lower RF (radio frequency) performance due to the replacement of SiGe-based HBT with Si-based BJT, wherein the lower RF performance is not relevant for an intended use of the integrated circuit.

In some embodiments, the substrate of this integrated circuit can further include CMOS (complementary metal-oxide-semiconductor) transistors. Therefore, in some embodiments, this integrated circuit can be manufactured using a single streamlined BiCMOS manufacturing process.

In some embodiments, this integrated circuit can include a Darlington NPN bipolar power stage in an ESD (electrostatic discharge) crowbar circuit.

The present invention further provides for a method comprising: (a) a npn SiGe-based HBT (heterojunction bipolar transistor) manufacturing process; (b) integrating a npn Si-based BJT (bipolar junction transistor) manufacturing process to the npn SiGe-based HBT manufacturing process. Therefore, one can take an established npn SiGe-based HBT (heterojunction bipolar transistor) manufacturing process, and then make a few modifications to also enable manufacturing of a npn Si-based BJT (bipolar junction transistor). An example of such a manufacturing process is shown by FIGS. 1-6.

In some embodiments, integrating the npn Si-based BJT (bipolar junction transistor) manufacturing process to the npn SiGe-based HBT manufacturing process can include: (i) re-using a base poly Si layer and an emitter poly Si layer from the npn SiGe-based HBT manufacturing process, (ii) adding one extra implant mask.

FIGS. 7A and 7B together show a process flow diagram of a method 700 for integrating a SiGe-based HBT (heterojunction bipolar transistor) and a Si-based BJT (bipolar junction transistor) together in a single manufacturing process, in accordance with some embodiments of the invention. As shown in FIG. 7A, the method 700 begins at step 705, where the method forms a patterned seed layer over all regions of a silicon substrate except for regions associated with the SiGe-based HBT. Then, the method proceeds to step 710. In step 710, the method deposits a SiGe base layer over all regions of the silicon substrate, wherein the SiGe base layer is poly-crystalline over all regions of the silicon substrate except the SiGe base layer is mono-crystalline over the regions associated with the SiGe-based HBT. Next, at step 715, the method removes the SiGe base layer over regions of the silicon substrate associated with the Si-based BJT. Continuing to step 720, the method deposits a poly Si layer over all regions of the silicon substrate, wherein the poly Si layer is either in-situ p+ doped or doped p+ by means of implantation. Then the method proceeds to step 725, where the method deposits an isolated dielectric layer over all regions of the silicon substrate. Subsequently in step 730, the method etches emitter window(s).

Then the process continues to FIG. 7B, and at step 735, the method implants base doping and optionally local collector doping in emitter window(s) over regions of the silicon substrate associated with the Si-based BJT, wherein a mask protects emitter window(s) over regions of the silicon substrate associated with the SiGe-based HBT. Continuing, the method proceeds to step 740. In step 740, the method anneals the silicon substrate to diffuse p-doping from the p+ poly Si layer to layers below the p+ poly Si layer, wherein the p-doping from the p+ poly Si layer is diffused to the SiGe base layer for the regions associated with the SiGe-based HBT, wherein the p-doping from the p+ poly Si layer is diffused to the silicon substrate for the regions associated with the Si-based BJT. Next, at step 745, the method forms inside spacer to isolate between an emitter n+ poly Si layer and the p+ poly Si layer. Continuing to step 750, the method deposits and etches the emitter n+ poly Si layer. Finally, at step 755, the method anneals the silicon substrate to diffuse n-doping from the emitter n+ poly Si layer into the base to form an emitter-base junction for both the SiGe-based HBT and the Si-based BJT.

In this specification, example embodiments have been presented in terms of a selected set of details. However, a person of ordinary skill in the art would understand that many other example embodiments may be practiced which include a different selected set of these details. It is intended that the following claims cover all possible example embodiments.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

The various aspects, embodiments, implementations or features of the described embodiments can be used separately or in any combination.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A method for integrating a SiGe-based HBT (heterojunction bipolar transistor) and a Si-based BJT (bipolar junction transistor) in a single manufacturing process, the method comprising:

forming a patterned seed layer over all regions of a silicon substrate except for regions associated with the SiGe-based HBT;

depositing a SiGe base layer over all regions of the silicon substrate, wherein the SiGe base layer is poly-crystalline over all regions of the silicon substrate except the SiGe base layer is mono-crystalline over the regions associated with the SiGe-based HBT;

removing the SiGe base layer over regions of the silicon substrate associated with the Si-based BJT;

depositing a poly Si layer over all regions of the silicon substrate, wherein the poly Si layer is either in-situ p+ doped or doped p+ by means of implantation;

depositing an isolated dielectric layer over all regions of the silicon substrate;

etching emitter window(s);

implanting base doping and optionally local collector doping in emitter window(s) into regions of the silicon substrate associated with the Si-based BJT to form a base, wherein a mask protects emitter window(s) over regions of the silicon substrate associated with the SiGe-based HBT;

annealing the silicon substrate to diffuse p-doping from the poly Si layer to layers below the poly Si layer, wherein the p+ doping from the poly Si layer is diffused to the SiGe base layer for the regions associated with the SiGe-based HBT, wherein the p+ doping from the poly Si layer is diffused into the silicon substrate for the regions associated with the Si-based BJT;

forming inside spacer to isolate between an emitter n+ poly Si layer and the poly Si layer;

depositing and etching the emitter n+ poly Si layer;

annealing the silicon substrate to diffuse n-doping from the emitter n+ poly Si layer into the base to form an emitter-base junction for both the SiGe-based HBT and the Si-based BJT.

2. The method of claim 1, wherein a device manufactured using the method has a lower emitter-to-collector leakage due to replacement of SiGe-based HBT with Si-based BJT, wherein the Si-based BJT has a lower emitter-to-collector leakage in the device due to elimination of the SiGe base layer which has a high density of crystal defects that cause emitter-to-collector leakage.

3. The method of claim 2, wherein the device manufactured using the method has a lower RF (radio frequency) performance due to the replacement of SiGe-based HBT with Si-based BJT.

4. The method of claim 3, wherein the single manufacturing process is a BiCMOS process.

5. The method of claim 4, wherein the device is an ESD (electrostatic discharge) clamp circuit.

6. The method of claim 5, wherein the device is a power stage in an ESD (electrostatic discharge) crowbar circuit.

7. The method of claim 6, wherein removing the SiGe base layer over regions of the silicon substrate associated with the Si-based BJT includes forming a variable capacitor diode within the silicon substrate.

8. The method of claim 1, wherein polarity of the SiGe-based HBT and the Si-based BJT devices is reversed from NPN to PNP, wherein the n-doping is replaced by p-doping and the p-doping is replaced by n-doping, wherein the n+ poly Si is replaced by poly Si and the poly Si is replaced by n+ poly Si.

9. The method of claim 1, wherein the patterned seed layer is comprising of one or more of the following:

silicon dioxide, silicon nitride, undoped poly Si.

10. The method of claim 1, wherein the SiGe base layer is comprising of one or more of the following:
   SiGe alloy of the form Si(1−X)Ge(X),
   Si together with SiGe alloy of the form Si(1−X)Ge(X),
   a 3-layer structure of Si/Si(1−X)Ge(X)/Si,
   a 3-layer structure of undoped Si/Si(1−X)Ge(X)/p-Si, wherein X is a fraction of Ge atoms contained in the SiGe alloy.

11. The method of claim 1, wherein the isolated dielectric layer is comprising of one or more of the following:
   LPCVD (low pressure chemical vapor deposition) silicon dioxide,
   silicon dioxide,
   silicon nitride.

12. The method of claim 1, further comprising forming an etch-protect layer between the SiGe base layer and the p+ poly Si layer over the regions associated with the SiGe-based HBT.

13. The method of claim 12 wherein the etch-protect layer is LPCVD (low pressure chemical vapor deposition) silicon dioxide.

\* \* \* \* \*